United States Patent
Hayes

(10) Patent No.: US 7,680,621 B2
(45) Date of Patent: Mar. 16, 2010

(54) TEST INSTRUMENT NETWORK

(75) Inventor: Todd A. Hayes, Macedonia, OH (US)

(73) Assignee: Keithley Instruments, Inc., Cleveland, OH (US)

( * ) Notice: Subject to any disclaimer, the term of this patent is extended or adjusted under 35 U.S.C. 154(b) by 312 days.

(21) Appl. No.: 11/839,295

(22) Filed: Aug. 15, 2007

(65) Prior Publication Data

US 2009/0048800 A1 Feb. 19, 2009

(51) Int. Cl.
 G05B 17/00 (2006.01)
 G06F 19/00 (2006.01)
 G06F 9/00 (2006.01)
 G06F 17/40 (2006.01)

(52) U.S. Cl. .................. 702/121; 324/73.1; 324/500; 324/537; 324/555; 700/1; 700/2; 700/3; 700/9; 702/1; 702/57; 702/58; 702/108; 702/123; 702/127; 702/187; 718/100; 718/102; 718/104

(58) Field of Classification Search ........... 324/73.1, 324/500, 537, 555, 754, 755, 759, 761, 765; 700/1, 2, 3, 4, 9, 11, 19, 86, 90; 702/1, 33, 702/57, 58, 59, 64, 65, 66, 69, 75, 79, 108, 702/117, 118, 119, 121, 122, 123, 124, 125, 702/126, 127, 182, 187, 188, 189; 714/1, 714/25, 32, 100; 718/100, 101, 102, 104

See application file for complete search history.

(56) References Cited

U.S. PATENT DOCUMENTS

| | | | | |
|---|---|---|---|---|
| 2,950,437 A | * | 8/1960 | Stahl | 324/73.1 |
| 2,996,666 A | * | 8/1961 | Baker | 324/73.1 |
| 3,082,374 A | * | 3/1963 | Buuck | 324/73.1 |
| 3,219,927 A | * | 11/1965 | Topp, Jr. et al. | 714/735 |
| 3,237,100 A | * | 2/1966 | Chalfin et al. | 324/108 |
| 3,487,304 A | * | 12/1969 | Kennedy | 324/73.1 |
| 3,522,532 A | * | 8/1970 | McCoy | 324/73.1 |
| 4,044,244 A | * | 8/1977 | Foreman et al. | 714/724 |
| 4,736,374 A | * | 4/1988 | Kump et al. | 714/32 |
| 5,265,832 A | * | 11/1993 | Wesling et al. | 246/169 R |
| 5,341,091 A | * | 8/1994 | Kurita | 324/750 |
| 7,240,258 B1 | * | 7/2007 | Hayes | 714/724 |

* cited by examiner

*Primary Examiner*—Edward R Cosimano
(74) *Attorney, Agent, or Firm*—Pearne & Gordon LLP

(57) ABSTRACT

A test instrument network for testing a plurality of DUTs includes a plurality of communicating script processors, the script processors being adapted to execute computer code; and a plurality of measurement resources controllable by the script processors in response to executed computer code, the measurement resources being adapted to test the DUTs. Each script processor and measurement resource may be arbitrarily assigned by the controller to one of at least two groups, only one script processor being assigned to be a master script processor, any other script processor being a slave script processor and any group not including the master script processor being a remote group. The master script processor is exclusively authorized to initiate code execution on any script processor in a remote group. Any slave script processor is only able to initiate operation of measurement resources in it own group. When a particular script processor is executing computer code, the master script processor may not initiate execution of computer code on a member script processor in the group of the particular script processor and may not initiate operation of a member measurement resource in the group of the particular script processor.

2 Claims, 1 Drawing Sheet

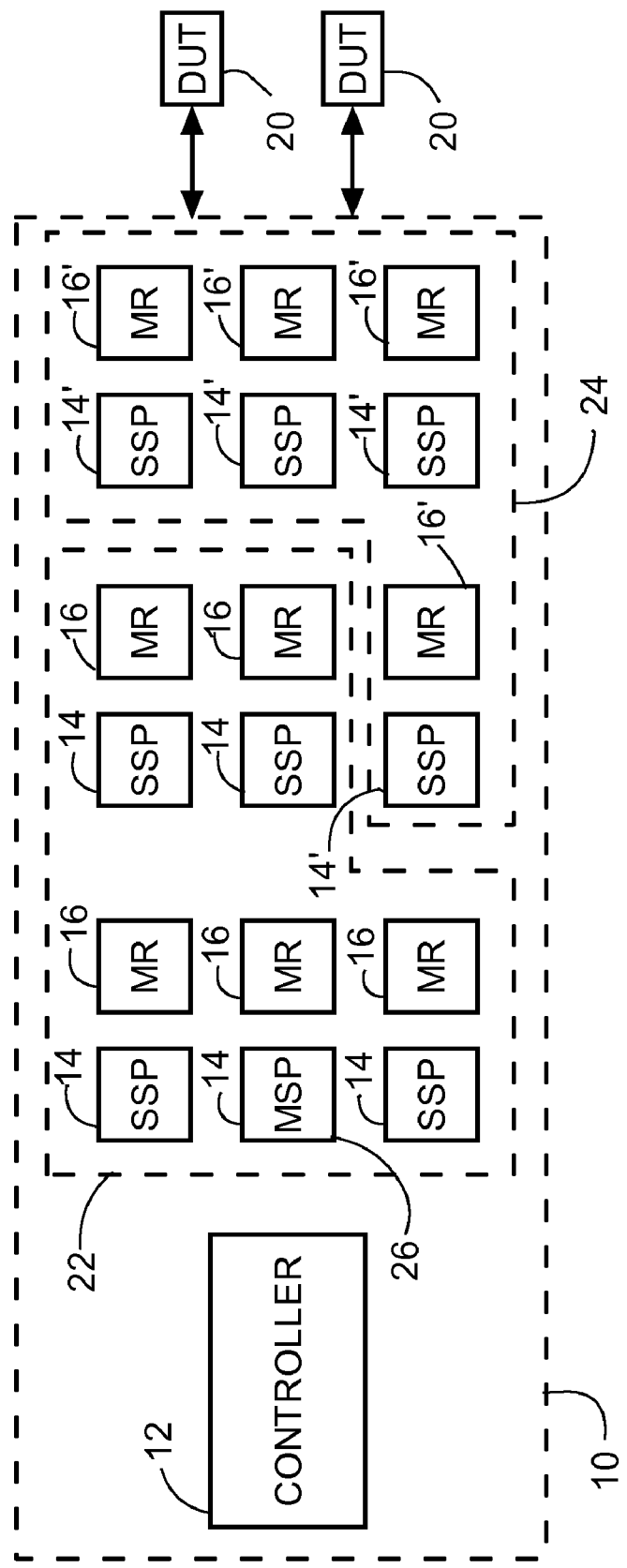

TEST INSTRUMENT NETWORK

BACKGROUND OF THE INVENTION

The present invention relates to electrical measurements and, in particular, to networked test instruments.

The electrical testing of devices under test (DUTs) such as semiconductors, integrated circuits, circuit boards and finished devices is an important part of the manufacturing of such goods.

Significant time (and expense) is expended to set up and perform tests of electrical parameters such as those related to performance and reliability. The tests themselves may take significant time resources and configuring the test systems in preparation for testing can also be very significant. This may be particularly true in an environment where the type of DUT is changed often, requiring the both the test equipment configuration and the tests to be performed to be changed.

The efficiency of the testing of DUTs may be improved by speeding up the setup process and the testing itself. Test instruments have been networked to provide better control over the configuration and testing processes and efforts have been made to increase the number of tests performed in overlapping time periods (i.e., in parallel).

SUMMARY OF THE INVENTION

A test instrument network for testing a plurality of DUTs includes a plurality of communicating script processors, the script processors being adapted to execute computer code; and a plurality of measurement resources controllable by the script processors in response to executed computer code, the measurement resources being adapted to test the DUTs. Each script processor and measurement resource may be arbitrarily assigned by the controller to one of at least two groups, only one script processor being assigned to be a master script processor, any other script processor being a slave script processor and any group not including the master script processor being a remote group. The master script processor is exclusively authorized to initiate code execution on any script processor in a remote group. Any slave script processor is only able to initiate operation of measurement resources in its own group. When a particular script processor is executing computer code, the master script processor may not initiate execution of computer code on a member script processor in the group of the particular script processor and may not initiate operation of a member measurement resource in the group of said particular script processor.

BRIEF DESCRIPTION OF THE DRAWINGS

The FIGURE is a block diagram of an example of a test instrument network according to the invention.

DESCRIPTION OF THE PREFERRED EMBODIMENTS

Referring to the FIGURE, a test instrument network 10 includes a controller 12, script processors 14, 14' and measurement resources 16, 16', all of the elements of the test instrument network being capable of inter-communication. The test instrument network 10 is used to test DUTs 20.

The controller 12 may be, for example, a personal computer, a mini-computer, a workstation, or a similar computer device. The script processors 14, 14' include a script processing engine and a scripting run-time environment. The script processors 14, 14' may be implemented with, for example, FPGAs, microcontrollers, or similar control devices. The measurement resources 16, 16' may be, for example, voltmeters, ammeters, voltage sources, current sources, source measure units, signal generators, modulators, demodulators, frequency meters, digital signal processors, timers, hardware synchronization lines, or similar devices. The controller 12, the script processors 14, 14', and the measurement resources 16, 16' may all communicate over a wired network, a wireless network, or a combination of both.

In one example, each script processor 14, 14' and each measurement resource 16, 16' are paired into a test instrument that combines the functions.

The test instrument network 10 permits the script processors 14, 14' and the measurement resources 16, 16' to be arbitrarily assigned into groups as desired to perform tests on the DUTs 20. For example, the group 22 may include the script processors 14 and the measurement resources 16 and the group 24 may include the script processors 14' and the measurement resources 16'. This assignment is controlled by the controller 12. It is of course possible to assign different and/or additional such groups from the elements available.

In the example shown, the group 22 includes a script processor 14 assigned to be a master script processor 26. This assignment is controlled by the controller 12. The test instrument network 10 may have only one master script processor at a time, but any of the script processors 14, 14' may be candidates. All of the other non-master script processors 14, 14' are considered to be slave script processors. Any group that does not contain the master script processor is considered to be a remote group, in this case, just the group 24.

The script processors 14, 14' are used to execute computer code (e.g., test scripts) that is used to control the operation of measurement resources 16, 16'. The measurement resources 16, 16' are controlled in response to the executed computer code.

The ability to dynamically assign groups and the master script processor greatly simplifies and enhances the process of configuring the test instrument network 10 for different applications and DUTs. The controller 12 specifies the configuration rather than having to physically move around connections and topologies.

The test instrument network 10 can also greatly facilitate parallel test operations. The test instrument network 10 is implemented so that script processors can be individually performing simultaneous operations without mutual interference. To do this, certain limitations are placed on the operation of the script processors.

Only the master script processor is permitted to initiate code execution on a slave script processor in a remote group. Slave script processors are only able to initiate operation of measurement resources within their own group. When a script processor is executing code, that script processor and its group are in an overlapped execution state. The master script processor may not initiate code execution on any script processor in a group that is in an overlapped execution state.

These rules permit parallel testing while maintaining order and discipline between script processors. While the execution of computer code on the script processors controlling measurement resources is restricted by these rules, the elements of the test instrument network can be free to exchange informational data (e.g., status and measurement) as desired.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A test instrument network for testing a plurality of DUTs, said network comprising:
   a controller;
   a plurality of communicating script processors, said script processors being adapted to execute computer code; and
   a plurality of measurement resources controllable by said script processors in response to executed computer code, said measurement resources being adapted to test said DUTs, wherein each script processor and measurement resource may be arbitrarily assigned by said controller to one of at least two groups, only one script processor being assigned to be a master script processor, any other script processor being a slave script processor and any group not including the master script processor being a remote group, said master script processor being exclusively authorized to initiate code execution on any script processor in a remote group, any said slave script processor only being able to initiate operation of measurement resources in the group of said any said slave script processor, and further, when a particular script processor is executing computer code, the master script processor may not initiate execution of computer code on a member script processor in the group of said particular script processor and may not initiate operation of a member measurement resource in the group of said particular script processor.

2. A test instrument network for testing a plurality of DUTs, said network comprising:
   a controller; and
   a plurality of communicating test instruments, said test instruments each having a script processor adapted to execute computer code and a measurement resource associated with said script processor, said measurement resource being controllable by said script processors in response to executed computer code and adapted to test said DUTs, wherein each script processor and measurement resource may be arbitrarily assigned by said controller to one of at least two groups, only one script processor being assigned to be a master script processor, any other script processor being a slave script processor and any group not including the master script processor being a remote group, said master script processor being exclusively authorized to initiate code execution on any script processor in a remote group, any said slave script processor only being able to initiate operation of measurement resources in the group of said any said slave script processor, and further, when a particular script processor is executing computer code, the master script processor may not initiate execution of computer code on a member script processor in the group of said particular script processor and may not initiate operation of a member measurement resource in the group of said particular script processor.

\* \* \* \* \*